US009209246B2

(12) United States Patent
Fonash et al.

(10) Patent No.: US 9,209,246 B2
(45) Date of Patent: Dec. 8, 2015

(54) ACCUMULATION FIELD EFFECT MICROELECTRONIC DEVICE AND PROCESS FOR THE FORMATION THEREOF

(71) Applicant: The Penn State Research Foundation, University Park, PA (US)

(72) Inventors: Stephen J. Fonash, State College, PA (US); Yinghui Shan, Cohoes, NY (US); Somasundaram Ashok, University Park, PA (US)

(73) Assignee: The Penn State University, University Park, PA (US)

( * ) Notice: Subject to any disclaimer, the term of this patent is extended or adjusted under 35 U.S.C. 154(b) by 0 days.

(21) Appl. No.: 13/934,794

(22) Filed: Jul. 3, 2013

(65) Prior Publication Data

US 2013/0285149 A1    Oct. 31, 2013

Related U.S. Application Data

(63) Continuation-in-part of application No. 12/102,398, filed on Apr. 14, 2008, now Pat. No. 8,569,834.

(60) Provisional application No. 60/911,378, filed on Apr. 12, 2007, provisional application No. 60/951,547, filed on Jul. 24, 2007.

(51) Int. Cl.
    H01L 27/088   (2006.01)
    H01L 29/06    (2006.01)
    (Continued)

(52) U.S. Cl.
    CPC ............. H01L 29/0673 (2013.01); B82Y 10/00 (2013.01); H01L 27/088 (2013.01);
    (Continued)

(58) Field of Classification Search
    CPC .................................................. H01L 29/0673
    USPC .................. 257/288, 348, E29.273, 402, 403
    See application file for complete search history.

(56) References Cited

U.S. PATENT DOCUMENTS

| 1,745,175 A | 1/1930 | Lillienfeld |
| 1,900,018 A | 3/1933 | Lillienfeld |

(Continued)

FOREIGN PATENT DOCUMENTS

JP          06275830 A     9/1994

OTHER PUBLICATIONS

Wind et al. "Vertical scaling of carbon nanotube field-effect transistors using top gate electrodes", Appl. Phys. Lett. 80, 3817 (2002).*

(Continued)

*Primary Examiner* — Allen Parker
(74) *Attorney, Agent, or Firm* — Dinsmore & Shohl LLP; Douglas L. Wathen

(57) ABSTRACT

A gated microelectronic device is provided that has a source with a source ohmic contact with the source characterized by a source dopant type and concentration. A drain with a drain ohmic contact with the drain characterized by a drain dopant type and concentration. An intermediate channel portion characterized by a channel portion dopant type and concentration. An insulative dielectric is in contact with the channel portion and overlaid in turn by a gate. A gate contact applies a gate voltage bias to control charge carrier accumulation and depletion in the underlying channel portion. This channel portion has a dimension normal to the gate which is fully depleted in the off-state. The dopant type is the same across the source, drain and the channel portion of the device. The device on-state current is determined by the doping and, unlike a MOSFET, is not directly proportional to device capacitance.

19 Claims, 6 Drawing Sheets

(51) Int. Cl.
  *H01L 29/78* (2006.01)
  *B82Y 10/00* (2011.01)
  *H01L 29/786* (2006.01)
(52) U.S. Cl.
  CPC ........... *H01L29/0665* (2013.01); *H01L 29/78* (2013.01); *H01L 29/78603* (2013.01); *H01L 29/78618* (2013.01); *H01L 29/78684* (2013.01); *H01L 29/78696* (2013.01); *H01L 29/7869* (2013.01); *H01L 29/78672* (2013.01); *H01L 29/78681* (2013.01)

(56) References Cited

U.S. PATENT DOCUMENTS

| | | |
|---|---|---|
| 5,012,315 A | 4/1991 | Shur |
| 5,198,379 A | 3/1993 | Adan |
| 5,275,851 A | 1/1994 | Fonash et al. |
| 5,814,869 A | 9/1998 | Dennen |
| 6,001,919 A | 12/1999 | Yen et al. |
| 6,750,471 B2 | 6/2004 | Bethune et al. |
| 6,821,911 B1 | 11/2004 | Lo et al. |
| 6,891,227 B2 | 5/2005 | Appenzeller et al. |
| 6,963,090 B2 | 11/2005 | Passlack et al. |
| 7,115,901 B2 | 10/2006 | Bertin et al. |
| 7,135,728 B2 | 11/2006 | Duan et al. |
| 8,569,834 B2 * | 10/2013 | Fonash et al. ............... 257/348 |
| 2003/0020136 A1 | 1/2003 | Kitabatake et al. |
| 2004/0144972 A1 | 7/2004 | Dai et al. |
| 2005/0176228 A1 | 8/2005 | Fonash et al. |
| 2005/0212014 A1 | 9/2005 | Horibe et al. |
| 2005/0275010 A1 * | 12/2005 | Chen et al. .................. 257/315 |
| 2005/0279988 A1 | 12/2005 | Bertin |
| 2006/0175601 A1 | 8/2006 | Lieber et al. |

OTHER PUBLICATIONS

Chen et al. "Letter the Role of Metal—Nanotube Contact in the Performance of Carbon Nanotube Field-Effect Transistors". Nano Lett., 2005, 5 (7), pp. 1497-1502.*
Avouris et al.; Chapter 9 "Carbon Nanotube Electronics and Optoelectronics" in "Applied Physics of Cargon Nanotubes: Fundamentals of Theory, Optics and Transport devices". 2005. ISBN: 978-3-540-23110-3 (Print) 978-3-540-28075-0 (Online).*
Yang et al. "Carbon nanotube Schottky diode and directionally dependent field-effect transistor using asymmetrical contacts". Applied Physics Letters 87, 253116 (2005); doi: 10.1063/1.214999.*
Yaish et al. "Electrical Nanoprobing of Semiconducting Carbon Nanotubes Using an Atomic Force Microscope". Phys Rev. Lett. 92 046401 (2004).*
Durkop et al. "Extraordinary Mobility in Semiconducting Carbon Nanotubes". Nano Lett. 4, 35 (2004).*
Javey et al. "Ballistic carbon nanotube field-effect transistors". Nature 424, 654-657 (Aug. 7, 2003).*
Zhu et al. "The Nature of Contact between Pd Leads and Semiconducting Carbon Nanotubes". Nano Lett., 2006, 6 (7), pp. 1415-1419.*
Javey et al. "Advancements in complementary carbon nanotube field-effect transistors". Electron Devices Meeting, 2003. IEDM '03 Technical Digest. IEEE International. Print ISBN: 0-7803-7872-5.*
Doyle, B.S., et al., "High Performance Fully-Depleted Tri-Gate CMOS Transistors"; IEEE Electron Device Letters, vol. 24, No. 4, Apr. 2003.
Xiang, Jie, et al., "Ge/Si nanowire heterostructures as high-performance field-effect transistors", Nature Publishing Group, vol. 441, May 2006.
Lee, Chi-Woo, et al., "Anaytcal model for the hgh-eperture behavour of the subtreshold slope in MuGFETs", Elsevier, Microelectronic Engineering 86 (2009) 2067-2071.
Afzalian, A., et al., "MultiGate SOI MOSFETs: Accumulation-Mode vs. Enhancement-Mode".

Jacoboni, C., et al., "A Review of Some Charge Transport Properties of Silcon", Solid-State Electronics, 1977, vol. 20, pp. 77-89.
Thompson, Scott E., "A 90-nm Logic Technology Featuring Strained-Silicon", IEEE Transactions on Electron Devices, vol. 51, No. 11, Nov. 2004.
Ramos, J., et al., "Experimental Evidence of Short-Channel Electron Mobility degadation caused by Interface Charges located at the Gate-Edge of Triple-Gate FinFETs", IEEE EXplore, 2006.
Weber, O., et al., "High Immunity to Threshold Voltage Variability in Undoped Ultra-Thin FDSOI MOSFETs and its Physical Understanding", IEEE Xplore.
Soree, Bart, et al., "Analytical and self-consistent quantum mechanical model for a surrounding gate MOS nanowire operated in JFET mode", J Comput Electron (2008) 380-282.
Soree, Bart, et al., "Silicon nanowire pinch-off FET : Basic opeation and analytical model", IEEE Xpolore.
Lee, Chi-Woo, et al., "Junctionless multigate field-effect transistor", Applied Physics Letters 94, 053511 (2009).
Cui, Yi, et al., "High Performance Silicon Nanowire Field Effect Transistors", Nano Letters, 2003, vol. 3, No. 2, pp. 149-152.
Shan, Yinghui, et al., "Unipolar accumulation-type transistor configuration implemented using Si nanowires", Applied Physics Letters 91, 093518 (2007).
Lu, Wei, et al., "Nanowire Transistor Performance Limits and Applications", IEEE Transactions on Electron Devices, vol. 55, No. 11, Nov. 2008.
Colinge, Jean-Pierre, et al., "Nanowire transistors without junctions", nature nanotechnology, Articles published online: Feb. 21, 2010, pp. 1-5.
Javey et al., "Carbon Nanotube Field-Effect Transistors with Integrated Ohmic Contacts and High-k Gate Dielectrics", vol. 4 No. 3, 447-450 of Nano Letters 2004.
Byon, D., et al. "Systematic study of contact annealing: Ambipolar silicon nanowire transistor with improved performance", Applied Physics Letters 90, 143513 (2007).
Shan, Yinghui, et al. "Unipolar accumulation-type transistor configuration implemented using Si nanowires", Applied Phsics Letters 91, 093518 (2007).
Fonash, Stephen J. "Numerical Modeling Study of the Unipolar Accumulation Transistor", Applied Physics Letters 91, 193508 (2007).
Hill, Richard J.W. et al. "Enhancement-Mode GaAs MOSFETs with an in 0.3 Ga0.7As Channel, a Mobility of Over 5000 cm2/V . s, and Transconductance of Over 475 us/um", IEEE Electron Device Letters, vol. 28, No. 12, Dec. 2007.
Lew, Kok-Keong, et al. "Growth characteristics of silicon nanowires synthesized by vapor-liquid-solid growth in nanoporous alumina templates", Journal of Crystal Growth 254 (2003) 14-22.
Wang, Yanfeng et al. "Use of Phoshine as an n-Type Dopant Source for Vapor-Liquid-Solid Growth of Silicon Nanowires", Nano Letters, 2005, vol. 5, No. 11, 2139-2143.
Shir, D. "Oxidation of silicon nanowires" J. Vac. Sci. Technol. B 24(3), May/Jun. 2006, pp. 1333-1336.
Westwater, J. et al. "The Characteristics and Oxidation of Vapor-Liquid-Solid Grown Si Nanowires", Mat. Res. Soc. Symp. Proc. vol. 452, 1997 Materials Research Society, pp. 237-242.
Wang, Yanfeng et al. "Top-Gated Field Effect Devices using Oxidized Silicon Nanowires", 2005 IEEE, pp. 159-160.
Jin, Song, et al. "Scalable Interconnection and Integration of Nanowire Devices without Registration", Nano Letters, 2004, vol. 4, No. 5, pp. 915-919.
Cui, Yi, et al. "High Performance Silicon Nanowire Field Effect Transistors", Nano Letters, 2003, vol. 3, No. 2, pp. 149-152.
Shan, Yinghui, et al. "From Si Source Gas Directly to Positioned, Electrically Contacted Si Nanowires: The Self-Assembling "Grow-in-Place" Approach", Nano Letters, 2004, vol. 4, No. 11, pp. 2085-2089.
Menard, E. et al. "Bendable single crystal silicon thin film transistors formed by printing on plastic substrates", Applied Physics Letters 86,, 093507 (2005).
Menard, E. et al. "A printable form of silicon for high performance thin film transistors on plastic substrates", Applied Physics Letters vol. 84, No. 26, (Jun. 28, 2004), 5398-5400.

(56) References Cited

OTHER PUBLICATIONS

Byon, K. et al. "Systematic study of contact annealing: Ambipolar silicon nanowire transistor with improved performance", Applied Physics Letters 90, 143513 (2007).

Shan, Yinghui, et al. "The self-assembling "Grow-in-Place" Process: An Environmentally Friendly Approach to Nanowire Device Fabrication", Mater. Res. Soc. Symp. Proc. vol. 901E.

Shan, Yinghui et al. "Silicon Nanowire Transistor Fabrication by the Self-assembling "Grow-in-Place" Approach with Mass Manufacturability", NSTI—Nanotech 2007, www.nsti.org <http://www.nsti.org>, ISBN 1420061828, vol. 1, 2007.

Cui, Yi, et al. "Doping and Electrical Transport in Silicon Nanowires", vol. 104, No. 22, Jun. 8, 2000.

Wu, Yue, et al. "Single-crystal metallic nanowires and metal/semiconductor nanowire heterostructures", Nature, vol. 430, Jul. 1, 2004, www.nature.com/nature <http://www.nature.com/nature>, pp. 61-65.

Wu, Yue et al. "Single-crysal metallic nanowires and metal/semiconductor nanowire heterostructures", Nature, vol. 430, Aug. 5, 2004, www.nature.com/nature <http://www.nature.com/nature>, p. 704.

Duan, Xiangfeng, et al. "High-performance thin-film transistors using semiconductor nanowires and nanoribbons", Nature, vol. 425, Sep. 18, 2003, www.nature.com/nature <http://www.nature.com/nature>, pp. 274-278.

Wang, Yanfeng, et al. "Inversion-mode Operation of Thermally-oxidized Modulation-doped Silicon Nanowire Field Effect Devices", 2006 IEEE, pp. 175-176.

Goldberger, Josh, et al. "Silicon Vertically Integrated Nanowire Field Effect Transistors", Nano Letters, 2006, vol. 6, No. 5, pp. 973-977.

Lauhon, Lincoln J. "Epitaxial core-shell and core-multishell nanowire heterostructures", Nature, vol. 420, Nov. 7, 2002, www.nature.com/nature <http://www.nature.com/nature>, pp. 57-61.

Wang, Dunwei et al. "Surface Chemistry and Electrical Properties of Germanium Nanowires", J. Am. Chem. Soc. 2004, 126, 11602-11611.

Passlack, Mathias, et al. "Implant-Free High-Mobilty Flaband MOSFET: Principles of Operation" IEEE Transactions on Electron Devices, vol. 53, No. 10, Oct. 2006, pp. 2454-2459.

"Transistors. Plugging the leaks. As physical limits bite, electronic engineers must build ever cleverer transistors". Aug. 20, 2011. The Economist.

* cited by examiner

Surface channel of
electrons can NOT form
---- No electrons available

Now generation/tunneling
here controls off current

Surface channel of holes
provided by source

NO blocking reverse
bias junction

FIGS. 3A-3F Core-shell top-gate SiNW transistor fabrication and FESEM image

US 9,209,246 B2

ACCUMULATION FIELD EFFECT MICROELECTRONIC DEVICE AND PROCESS FOR THE FORMATION THEREOF

REFERENCE TO RELATED APPLICATIONS

This application is a continuation-in-part of U.S. patent application Ser. No. 12/102,398 filed Apr. 14, 2008, that in turn claims priority of U.S. Provisional Application Ser. No. 60/911,378 filed Apr. 12, 2007 and U.S. Provisional Application Ser. No. 60/951,547 filed Jul. 24, 2007; the contents of all of which are incorporated herein by reference.

STATEMENT REGARDING FEDERALLY SPONSORED RESEARCH OR DEVELOPMENT

This invention was made with government support under Grant No. DMI0615579, awarded by the National Science Foundation. The Government has certain rights in the invention.

FIELD OF THE INVENTION

The present invention relates in general to field effect microelectronic devices and in particular to a field effect device having a substantially single dopant type across source, gated intermediate portion, and drain.

BACKGROUND OF THE INVENTION

A conventional metal oxide semiconductor field effect transistor (MOSFET) utilizes heavily doped source and drain semiconductor regions to form ohmic contacts to a gate induced inversion-layer channel portion. In the on-state, transport in this channel portion controls the source-drain current, $I_{DS}$. In the on-state, the inverted channel is not shunted due to the presence of a reversed-biased n/p or p/n junction at the drain. In the off-state there is no inversion in the channel portion and the current, $I_D$ is blocked by the reverse biased n/p or p/n junction at the drain. The thin film transistor (TFT) is a variant of the MOSFET in which an on-state conducting channel is also not shunted but, in this case, due to a reversed bias i/n or i/p junction at the drain which is in series with the additional impediment of the thin, resistive i-layer under the gate. Both TFTs and MOSFETs are types of field effect transistor (FET) structures.

A typical FET device includes a gate, drain, and source. Typically, the gate is used to control the device by applying an adequate voltage to the gate to generate an electric field that in turn creates a conductive path in an underlying channel layer intermediate between the drain and source. A device in which conduction exists between the source and drain is considered to be ins an on-state whereas a lack of conduction is considered as an off-state.

The gate, the third terminal of these devices, needs to be electrically isolated from the channel layer. To achieve electrical isolation of the gate, a dielectric material such as silicon dioxide is provided intermediate between the gate and the underlying channel layer. To improve device characteristics it is often desired to reduce the dielectric (insulator) layer thickness to increase gate capacitance and improve gate to channel coupling. An inverse proportionality exists for MOSFET and TFT type devices between the gate capacitance and insulating layer thickness. Unfortunately, reducing insulating layer thickness beyond a certain point has proven difficult as gate leakage current outweighs any benefits achieved through gate capacitance increases.

The trend in microelectronics is to ever smaller devices since this allows for faster operating speeds and greater functionality per area. Fabricating such small devices can be costly since the processing involved generally necessitates multiple etching and deposition steps all guided by lithography. Nanowires, nanotubes, and nanoribbons are inherently small; hence there is a great deal of interest in fabricating FET devices using these materials.

FET structures that can be fabricated with the dimension normal to the gate being in the nanoscale include TFTs on ultra-thin semiconductors, SOI-type structures, thin-fin devices and nanowire devices. Among these possibilities, devices with a single doping type have been fabricated using nanowires (NWs) by Lieber et al.[5,6,7], Mayer et al.[8], and Yang et al.[9] These have used semiconductor nanowires of a single doping type and concentration, ohmic source and drain contacts to this semiconductor, and metal/insulator gates and have been professed to be MOSFETs[5,6,7,8,9]. These prior art devices have stressed the importance of gate capacitance, $C_I$ in on-state operation. The prior art has not taught the role of doping concentration on on-state current, has not taught the importance of the position of ohmic contacts with respect to channel edges, the correct role of $C_I$ in on-state operation, nor the role of the doping concentration in the various regions of the transistor on performance of single doping-type FETs. The role of the voltage $V_{DS}$ developed between the source and drain in a single doping type structure has not be realized and there has been a lacking of guidance as to device design. In fact, Mayer et al. has strongly taught away from NW FET structures with single doping type citing that they are not capable of good on-current to off-current ratios nor of good subthreshold slopes (swing) values.[8] Thus, there exists a need for a gated microstructure that is simple to fabricate and has straightforward design rules. Using a single doping type for the source, gate, and drain regions, as disclosed in this invention, is a major simplification step as is the disclosed use of substantially ohmic contacts to the source and drain regions. Further, having a FET device whose dependence on gate capacitance is weaker than that of a MOSFET overcomes the problem of the need for close fabrication control of the gate insulator. There also exists a need for a simplified formation of FET-type structure to advance the operation of microelctronics and macroelectronics (electronics applied to large areas).

SUMMARY OF THE INVENTION

A gated microelectronic device is provided that has an ohmic contact to a source semiconductor region characterized by a source dopant type and concentration and linear extent. There is also an ohmic contact to a drain semiconductor region which is characterized by a drain dopant type and concentration and linear extent. A voltage is imposed in operation between the drain and the source. A channel portion intermediate between the source and the drain is characterized by a channel portion dopant type and concentration and defines a channel portion linear extent and a channel portion thickness. An insulative dielectric is in contact with the channel portion and overlaid in turn by a gate. A gate contact applies a gate voltage bias to control charge carrier accumulation and depletion in the underlying channel portion. The dopant type is the same across the source, drain and the channel portion of the device. Ambipolar behavior of the device is prevented by dimensional and dopant concentration level selections. The device exhibits FET behavior with an on-state when accumulated and an off-state when depleted.

DESCRIPTION OF THE INVENTION

Figure 1A:
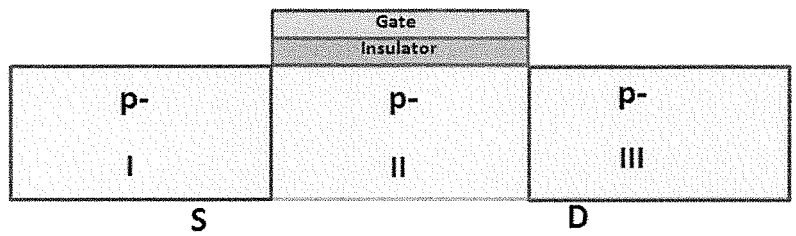
FIG. 1A is a cross-sectional schematic of an inventive device with functionally inactive portions such as a substrate and passivating layers not being shown for visual clarity.

The present invention has utility as a microelectronic device. An inventive device is an accumulation type MOSFET and relies on the formation of a charge carrier accumulation layer and channel portion under the gate to create a conductive on-state. The inventive device is simple to fabricate as a single dopant type is used across source, channel portion, and drain. Single dopant type is either an n-type or p-type dopant. To further simplify fabrication, an inventive device also optionally has a uniform dopant concentration of single dopant type across the source (region I of FIG. 1), channel portion (region II of FIG. 1), and drain (region III of FIG. 1). In operation, an inventive device operates by way of the volume of the channel portion under the date accumulating (on-state) or depleting (off-state) charge carriers thereby switching between conduction and isolation between the source and drain, respectively. For an inventive device to function as a transistor, in the off-state, the charge carrier depletion within a channel portion must occupy the complete depth of the channel portion under the gate so as to preclude leakage between source and drain. As a result, the channel portion in an inventive device has an ultra thin semiconductor. More generally, the dimension normal to the gate is ultra-thin.

As used herein "ultra thin" is defined as being capable of being depleted of charge carriers under the appropriate gate bias; i.e., depleted under positive gate bias for p-type doping and depleted under negative gate bias for n-type doping. Typically, the ultra thin semiconductor has a dimension normal to the gate (e.g., diameter of a nanowire, thickness of a thin film) of less than 100 nanometers and more than 5 nanometers and preferably less than 80 nanometers.

An ultra thin semiconductor channel portion according to the present invention can be readily formed from the silicon of silicon-on-insulator structures, from semiconductor thin films such as those typically formed by techniques such as physical vapor deposition, chemical vapor deposition, and atomic layer deposition techniques, and from semiconductor nanowires, nanoribbons, and nanotubes, where nanotubes define a hollow shell as opposed to a filled core nanowire. The semiconductor thin films and nanowires, nanoribbons, and nanotubes can be comprised of a variety of materials illustratively including carbon, germanium, silicon, II-VI semiconductors, III-V semiconductors, and mixtures and layered structures thereof This inventive device class, herein synonymously termed an AMOSFET (accumulation metal oxide semiconductor field effect transistor), affords a number of operational and fabrication advantages over conventional MOSFETs and TFTs. These advantages include a simplicity of fabrication being operational with a single doping type across source, channel portion, and drain and with only requiring ohmic contacts to the source and drain regions as seen in FIG. 1. An inventive device operates with dopant concentrations of between $10^{12}$ per $cm^3$ and $10^{19}$ per $cm^3$ and preferably at between $10^{14}$ per $cm^3$ and $10^{18}$ per $cm^3$. The presence of ohmic contacts separated from the edges of the channel region as seen in FIG. 1 means that an inventive device can operate without ambipolar behavior. Another unique aspect of the AMOSFET is that the dependence of its current-voltage (I-V) behavior on gate capacitance is much less than that seen for MOSFETs and TFTs.

A related similar device developed subsequent to the present invention by Byon et al.[23] used ohmic contacts and one doping type silicon NWs in an accumulation type FET but did not use the innovation of positioning the ohmic contacts away from the channel edges. As a consequence, this other device exhibits ambipolar behavior (i.e., with p-type doping it inverts under positive gate bias instead of depleting only) which can be very deleterious in circuit applications. In contrast, the inventive device has the properties and the positioning of the ohmic contacts that eliminate ambipolar behavior or, alternatively, if it is desired, optionally attain ambipolar behavior in a single doping type FET.

To eliminate ambipolar behavior, the ohmic contacts in the inventive device of FIG. 1 are separated from the channel edges and are non-contiguous therewith. These contacts are substantially ohmic giving no significant voltage drop while passing current and unable to supply the necessary significant minority carrier injection needed to create and sustain an inversion layer In any case, the dimensional extent of regions I and III are such that, under gate biasing that is conducive to inversion layer formation, the minority carrier density in the portion of these regions near the channel edges cannot differ significantly from that present in thermodynamic equilibrium insuring a sustained inversion layer can not be developed.

Additionally, an inventive device ameliorates the need for close control of the thickness of the dielectric insulating the gate from the underlying channel portion since on-state current depends on material doping and is not directly proportional to gate capacitance, $C_I$, which it is in MOSFETs and TFTs, Additionally the voltage drop between source and drain can be readily integrated into local interconnects and formation of a very-large-scale integration (VLSI); i.e., the source and drain regions can be part of the interconnects, if desired. As a consequence of the weak dependence on the insulating dielectric thickness underlying a gate, device performance problems associated with quantum mechanical carrier tunneling through the gate dielectric can be largely circumvented.

Figure 1B:
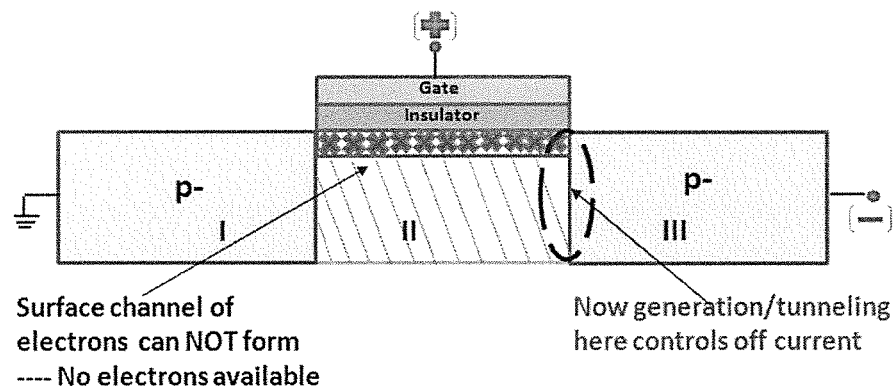
FIG. 1B is a schematic depicting the inventive device of FIG. 1A with electrical contacts of the drain and gate biased relative to the source so as to place the device in an off-state configuration.
Figure 1C:
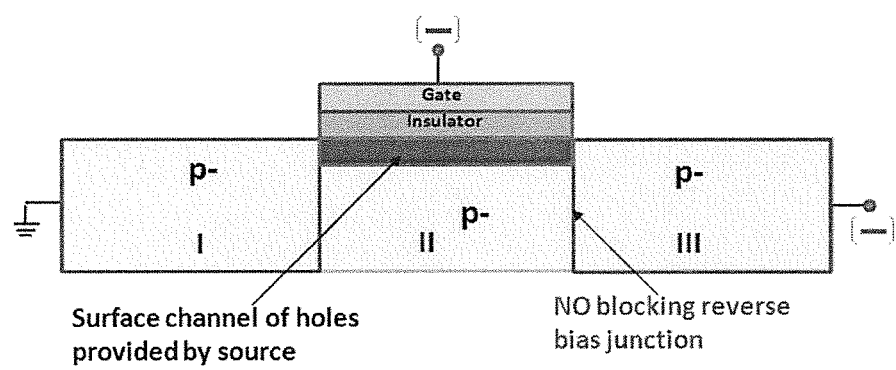
FIG. 1C is a schematic depicting the inventive device of FIG. 1A with electrical contacts of the drain and gate biased relative to the source so as to place the device in the on-state configuration.

The structure and operation of an inventive device operating as an accumulation MOSFET is provided in FIGS. 1A-C. While the description of the present invention that follows details for illustrative purposes a wholly p-type doped device based on a silicon nanowire operational as the ultra thin semiconductor, it is appreciated that the other ultra thin semiconductors such as those possible in TFT and SOI configurations, as well as other nanotubes, nanoribbons, and nanowire materials, are also operative herein. It is understood that a device can be wholly p or n-type and that doping concentration can be essentially constant or varied across a device. FIGS. 1A-C show in region I a p-type doped semiconductor source region in region I (S of FIG. 1A) and a region III also p-type doped constituting a semiconductor drain (D of FIG. 1A). Region II corresponds to a channel portion of p-type doping on which are applied an insulative dielectric and a gate thereover. Regions I, II and III have the same doping type which may vary in concentration across the device. For example, the doping concentration may be chosen to be larger in the source-drain regions than under the gate or vice versa.

In an off-state as depicted in FIG. 1B, a bias is applied to the gate by way of a contact to deplete region II corresponding to the channel portion so as to deplete the channel portion of charge carriers and as a result only a nominal drain current can flow when the drain voltage $V_{DS}<0$ is applied between the drain and source. It is appreciated that with n-type doping opposite polarity gate biases are applied to gate induce an off-state. According to an inventive device, the semiconductor of the channel portion (region II) cannot readily invert in off-state biasing due to the adjacent p-type source and drain regions (regions I and III, respectively). In the event that inversion were to occur in the channel portion (region II), charge carrier transport in the resulting inversion layer would be limited by reverse bias p-region contacting this inversion layer.

In the on-state, as depicted in FIG. 1C, a sufficient negative gate bias $V_G<0$ region II accumulates charge carriers and a drain current, $I_D$, flows when the drain voltage $V_{DS}<0$ applied between the drain and source. Since region II is accumulated, $I_D$ before saturation must be principally a drift current. Taking all three regions (I, II, and III) to have the same doping type and same linear extent $L_G$, for example, $I_D$ before saturation can be approximately modeled as $$I_D = eN_A\mu_p V_A/L_G \quad (1)$$

where $N_A$ is the semiconductor doping density, $\mu_p$ is its hole mobility, and $V_A$ is a voltage obeying $|V_A| \le |Y_{DS}|$. Eq. (1) in an approximate description of the linear section of the output characteristics such as that seen in the experimental data plotted in FIG. 2A. This equation points out that this region of the output characteristics of an inventive device is controlled by the doping $N_A$ and not by the gate capacitance $C_I$ per area as is the case in a traditional MOSFET. This equation further shows that $I_D$ in the linear region is on of the order of the current which would flow for the same $V_{DS}$. These features of linear dependence on doping and lack of MOSFET-like dependence on gate capacitance have been substantiated by detailed AMOSFET numerical modeling.[24] As shown also in that detailed AMOSFET numerical modeling, the saturation behavior in a p-type doped device, for example, arises from the pulling of holes primarily out of region II. The output and transfer characteristics that result from the overall linear and saturation regions behavior are those of a "conventional" MOSFET or TFT as seen in the experimental data of FIGS. 2a and 2b.

An inventive device functions due to an ultra thin semiconductor channel portion of this one-doping-type device and the switching that occurs based on carrier accumulation in the on-state, and carrier depletion in the off-state of this channel portion. The doping concentrations in regions I and III are optionally changed from that of region II, but unlike a MOSFET, the doping type cannot be changed. Ambipolar behavior, synonymously detailed as an inversion layer formation in what should be the off-state, is precluded by ohmicity of the source and drain contacts and the linear extent of regions I and III, these being such that the minority carrier density in the portion of these regions I and III near the channel edges of region II does not differ significantly (i.e., not able to sustain an inversion region) from that present in thermodynamic equilibrium. It is appreciated that linear extent takes into account the interchanging of the roles of source and drain. This linear extent L will depend on the quality of the ohmic contacts and can be determined experimentally by determining the linear extent needed to stop ambipolar behavior. Preferably, both regions I and III have linear extents of greater than or at least equal to that necessary to avoid sustained inversion layer creation in region II. Alternatively, ambipolar behavior is achieved by making the linear extents of regions I and III equal to or less than that necessary for sustained inversion layer creation in region II.

It is appreciated that through coupling of n-type and p-type AMOSFETs hooked up in series, multiple inventive devices act reciprocally as the load for each other to construct logic circuits and other VLSI components.

Figure 6:
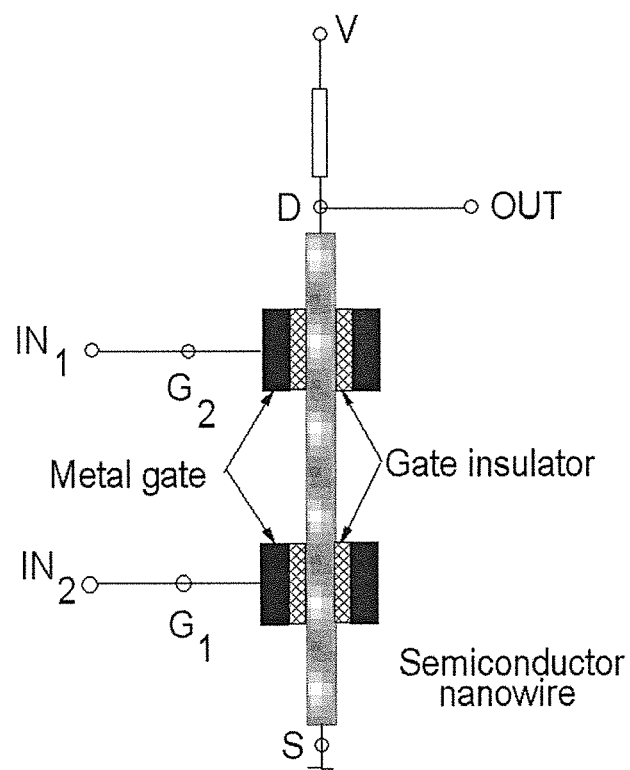
FIG. 6 is a top view schematic of an inventive NOT AND (NAND) gate device.

A Dual-gated AMOSFET is optionally formed with two gate regions between the source and drain ohmic contacts as shown in FIG. 6. A 4-terminal device, with gates G1 and G2, along with source S and drain D is provided. With two independent input signals applied to G1 and G2, the device will turn ON only when both G1 and G2 are HIGH. With a normal resistive load at the drain, this gives a NOT AND (NAND) gate operation. Such a configuration with conventional transistors would suffer from complications of level shifting between the two gate signals, but it can be possible to avert this with the AMOSFET due to the entirely different operating principles. For instance, the nanowire mid-region between the two gates is controlled both in geometry and dopant concentration. It is appreciated that any number of gates may be stacked, yet preferably the number of gates is limited to two.

Alternatively, the dual-gated device of FIG. 6 is operated with a single input; i.e. with gates G1 and G2 shorted. The purpose of this is to alter the device characteristics by controlling the length of the mid-region. The device in this operational mode functions as a light sensor with a beam of light incident on the mid-region altering the potential distribution along the length of the nanowire and affording photogain.

An inventive device can be readily used for a number of applications including such diverse examples as pixel control, sensing, and electro-static discharge control. An inventive device can form various circuit elements. Its particularly simple configuration can allow such elements to be uniquely attained. For example, a NOT AND (NAND) gate device can be made with a uniformly doped ultra thin semiconductor channel portion of one doping type and the inclusion of four ohmic contacts.

To further appreciate fabrication and operating performance of an inventive device, reference is made to the following nonlimiting example which are intended to illustrate specific exemplary devices and not to limit the interpretation or scope of the appended claims.

Example 1

AMOSFET Fabricated Using a Template on a Substrate

An inventive device is fabricated using silicon nanowire material. The nanowires are grown on a substrate and transistors fabricated in situ. No transfer process is utilized. An inventive device fabrication began with the vapor-liquid-solid (VLS), grow-in-place silicon nanowire (SiNW) growth process in growth channels approach previously detained in U.S. Patent Application Publication 2005/0176228.

Figure 3A:
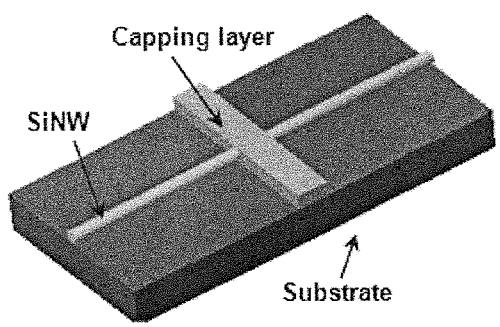
FIGS. 3A-3D depict a construction technique as perspective views for an inventive device according to techniques detailed in United States Patent Application Publication US 2005/0176228 A1.
Figure 3B:
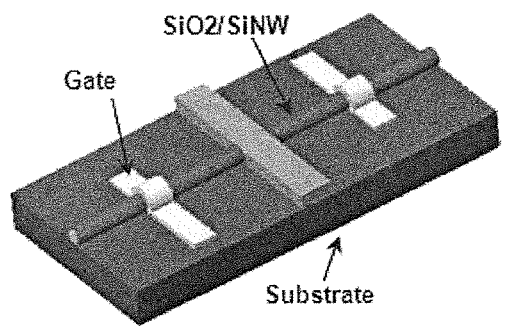
Figure 3C:
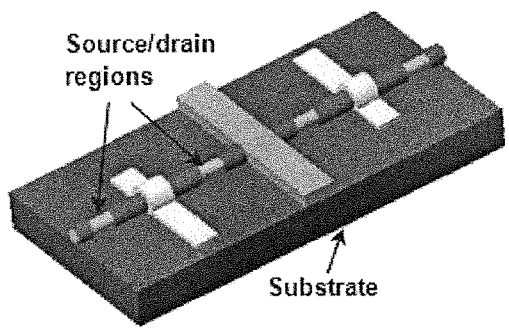
Figure 3D:
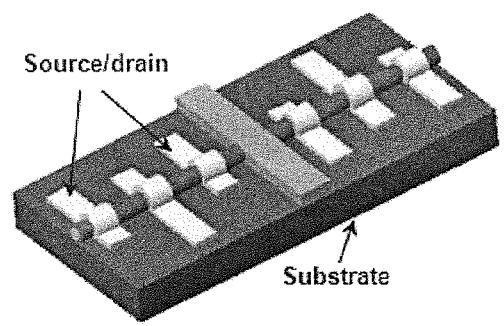
Figure 3E:
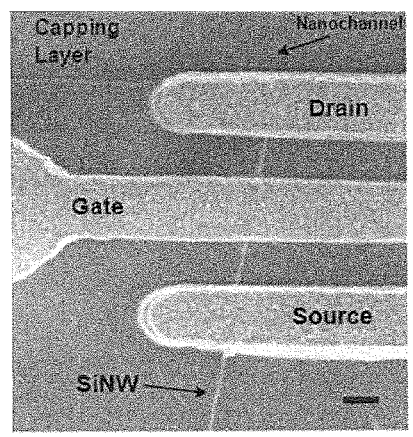
FIGS. 3E and 3F are field effect scanning electron micrographs (FESEMs) of several inventive devices.
Figure 3F:
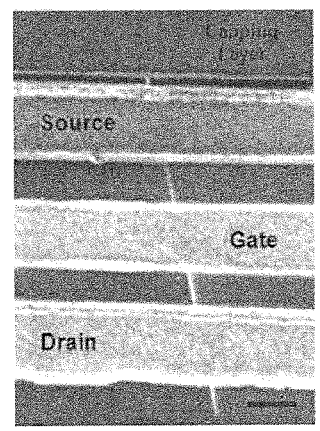

In the grow-in-place variation used here, Corning 1737 glass, serves as the substrate on which the permanent growth-templates are constructed. Template construction is known[2,4] and the use of such templates is summarized in FIG. 3 for the fabrication of the inventive devices of this example. The resulting permanent templates are designed to allow vapor-liquid-solid (VLS) nanowire growth in, and then finally extrusion out of, the guiding nanochannels under the capping layer of FIG. 3 in the particular version of grow-in-place used herein. In other versions, the transistor can be fabricated on a nanowire confined in the template (See Yinghui Shan and Stephen J. Fonash, "Self-Assembling Silicon Nanowires for Device Applications Using the Nanochannel-Guided "Grow-inPlace" Approach", American Chemical Society, Published online Feb. 22, 2008, 10.1021/nn700232q CCC.) Using extruded wires for fabricating transistor is seen in the micrographs of FIGS. 3E and 3F. Other grow-in-place procedures operative herein are also discussed in U.S. Patent Application Publication 2005/0176228. This silicon nanowire VLS growth is carried out in a liquid precursor chemical vapor deposition (LPCVD) reactor at 500° C. and 13 Torr, using 5% $SiH_4$ diluted in $H_2$ with a total flow rate of 100 sccm[2,10]. The grow-in-place approach produced SiNWs positioned where desired on the substrate. These wires are held at the template end by the channels of the permanent templates as shown in the sequence of FIGS. 3A-3D and, as seen, fabricated into devices.

After the nanowire growth, the residual gold used to catalyze the VLS process is completely removed by rinsing the whole sample in gold etchant following by deionized (DI) water cleaning. Other VLS catalysts such as Ti, for example, are also operative herein. The silicon nanowires are subsequently subjected to a modified standard cleaning. Prior art[2,11] indicates that this Si material grown by the gold-catalyzed VLS process is p-type due to inadvertent Au doping during the VLS process. Transistor structures are then made in situ. Thereafter, an HF etch, a wrap-around encapsulating $SiO_2$ layer is grown by dry thermal oxidation at 700° C. for 4 hours using a 3 L/min $O_2$ flow rate[8,12,13]. This oxidation resulted in a $Si/SiO_2$ core-shell structure[8,12,14,15] with about a 10 nm thermal silicon oxide surrounding the silicon nanowires. This oxide is removed in selected source/drain contact regions using standard processing and the contact metals (400 nm Ti/50 nm Au) are deposited with the Ti contacting the silicon nanowires, followed by lift-off. The gates of the silicon nanowire transistor structures are then patterned and formed by depositing the Ti (400 nm)/Au (50 nm) on the gate oxide. From FESEM studies, the diameter of the resulting silicon nanowire transistor structures with their wrap-around oxide is about 75 nm, with the actual silicon nanowire having a diameter of about 55 nm and a surrounding 10 nm thick oxide shell. These transistors had 2 μm gate length (LG) and 2.5 μm gate-source/gate-drain spacings, with a source length of 2.5 μm and a drain length of 2.5 μm.

Figure 2A:
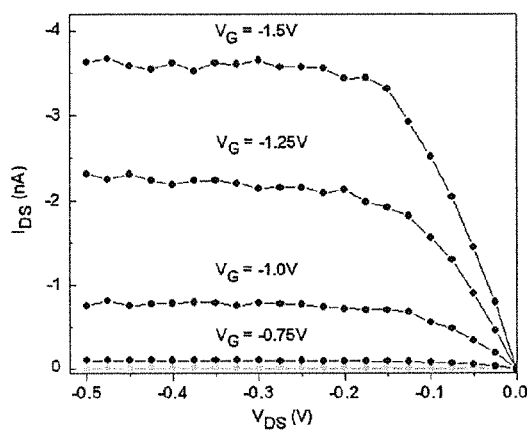
FIG. 2A is a plot of experimental source drain current $I_{DS}$ as a function of voltage $V_{DS}$ for different applied gate bias values $V_G$ for the inventive device depicted in FIG. 1.
Figure 2B:
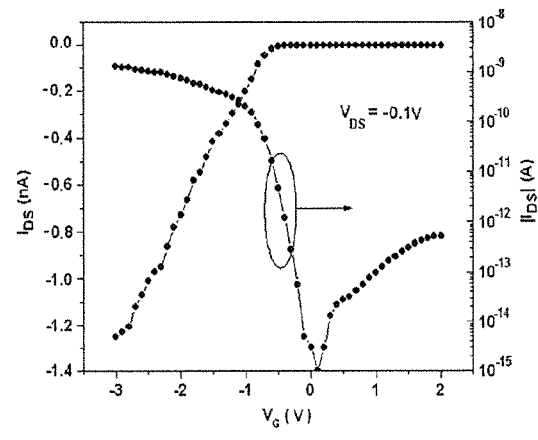
FIG. 2B is a plot of experimental source drain current $I_{DS}$ as a function of applied gate bias $V_G$ with $V_{DS}=-0.1V$ for the inventive device depicted in FIG. 1.

The performance of the inventive device structures fabricated using the grow-in-place silicon nanowires was evaluated using an Agilent 4156 Precision Semiconductor Parameter Analyzer and results are presented in FIG. 2. Single silicon nanowire transistor structures are employed in the evaluation. The plot of FIG. 2A gives the measured output characteristics for a typical grow-in-place SiNW transistor for values of the gate voltage $V_G$ stepped from 0.5V (bottom) to −1.5V (top) in −0.25V increments. Each $I_D$-$V_{DS}$ curve (e.g., the curve for $V_G$=−1.5 V) shows that the drain current absolute value $|I_D|$ first increases and then saturates, as observed for a conventional MOSFET. The corresponding measured transfer characteristics with $V_{DS}$ fixed at −0.1 V are shown in FIG. 2B as the semi-log plot along with a linear plot of $I_D$ versus $V_G$ (scale on the left ordinate) for determining the threshold voltage. From the semi-log plot, which is also typical of that observed for a conventional MOSFET, the device is seen to have an on/off ratio of $10^6$ and a subthreshold slope (SS) of 130 mV/dec. Although this latter value is approximately double the best value in single crystal silicon devices (70 mV per decade)[16], this subthreshold slope appears to be the lowest value ever reported for a single top-gate or bottom-gate nanowire device and is much lower than the typical values (>300 mV/dec) reported for single, top-gate or bottom-gate nanowire devices.[7,17,18,19] This SS is also comparable to the best value (120 mV/dec) seen for vertical silicon nanowire array devices[9]. In addition, this value is lower than the best values reported for poly-Si TFTs (200 mV per decade).[20]

The data of FIG. 2B show that an inventive device structure of this example has an off-state with positive gate voltages, turn-on with negative gate voltages, and has a threshold voltage of about −0.6V. Without intending to be bound by a particular theory, it is seen that the carriers in the on-state are holes and that the on-state behavior is due to a hole accumulation layer in region II for negative gate voltages. It follows that the off-state of these transistors is produced by fully depleting the ultra thin semiconductor of charge carriers, a situation which is easily attained due to the nanoscale cross-sectional dimensions thereof. The experimental data of FIG. 2B make it clear that ambipolar behavior was not present in the devices of this example.

Example 2

Growth Channel Template Transfer and Stamp Technique

Figure 4A:
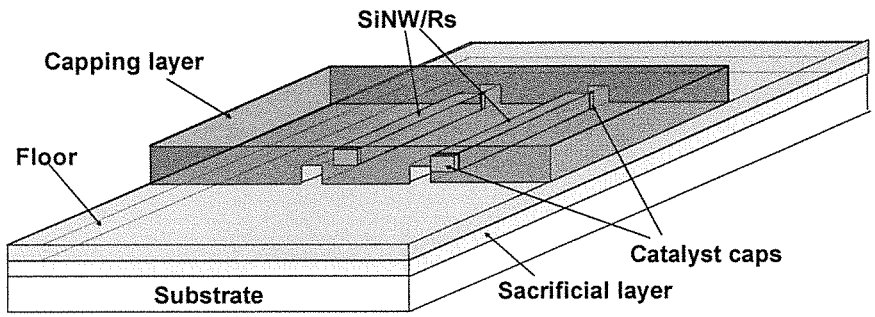
FIGS. 4A-4D are partially transparent schematic representations of steps associated with the use of growth channel input transfer for a long channel template.
Figure 4B:
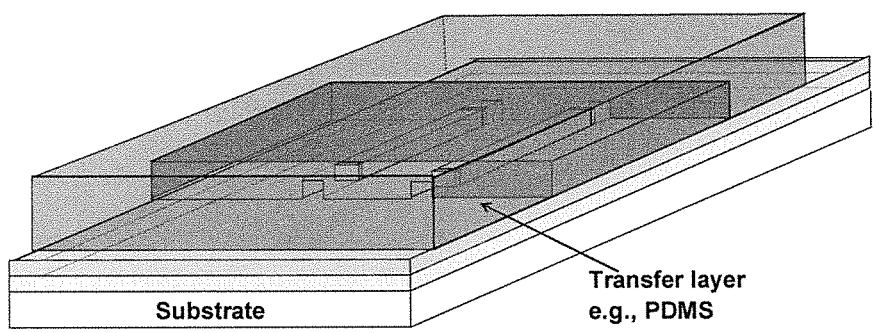
Figure 4C:
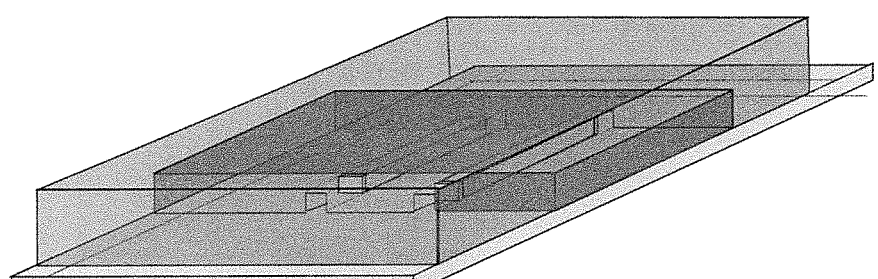
Figure 4D:
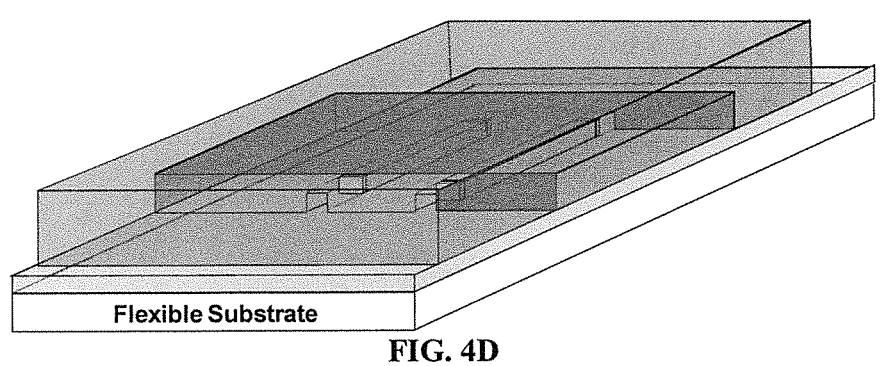
Figure 5A:
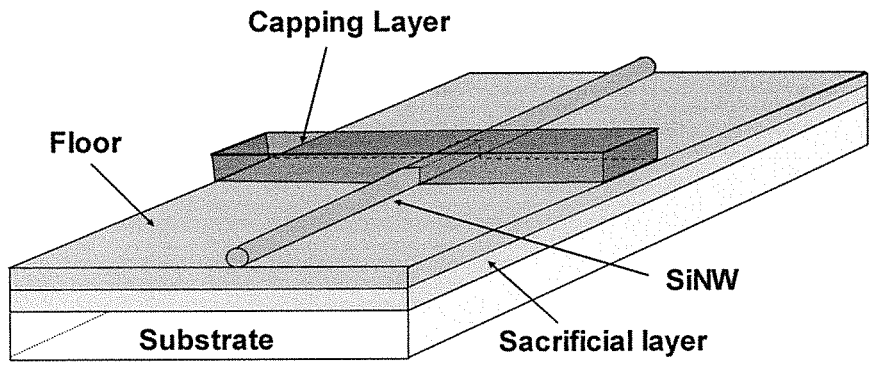
FIGS. 5A-5D are partially transparent schematic representations of steps associated with the use of growth channel input transfer for a short channel template.
Figure 5B:
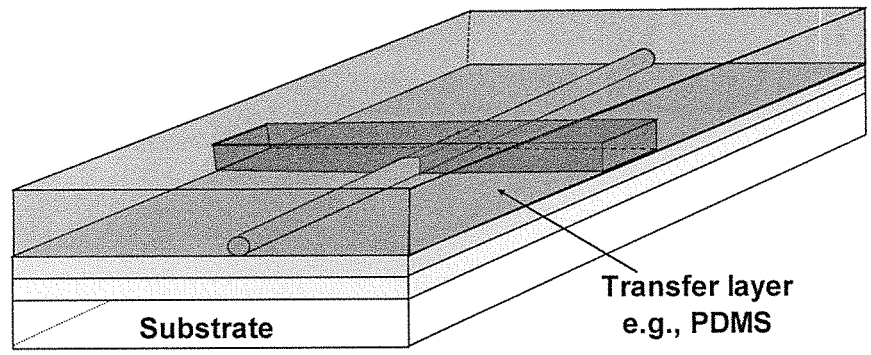
Figure 5C:
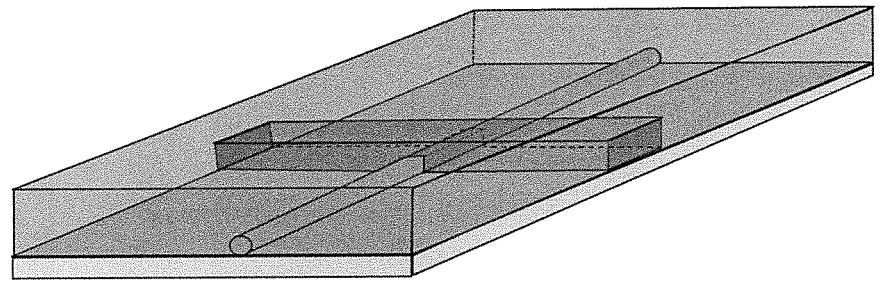
Figure 5D:
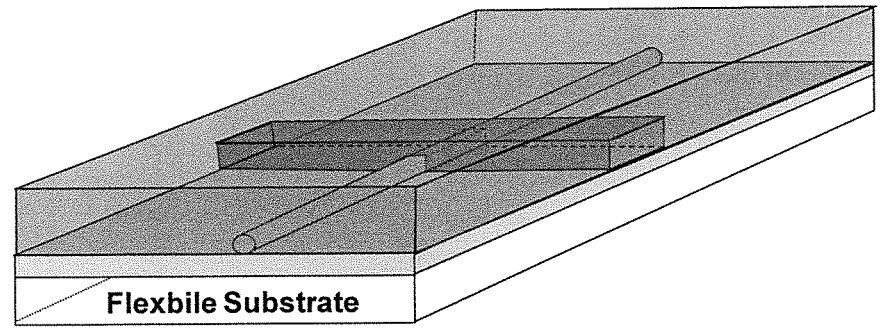

The growth channel template method utilized with a transfer approach is detailed for also producing an inventive device. FIGS. 4A-D and FIGS. 5A-D show the schematic representations of the use of the growth channel templates with a transfer approach. These growth channel templates are made on a mother substrate. Two versions of channel templates are shown: a long/encapsulated channel template (FIG. 4) and a short channel template (FIG. 5). These both show the channel template transfer after nanowire growth from a mother substrate to a flexible substrate. Inventive device fabrication is completed either before or after transfer. Growth channel templates can also be transferred from the mother substrate to the final substrate before nanowire, nanoribbon or nanotube growth in the same way. When done in this manner, full transistor fabrication is done after wire/ribbon growth transfer, with nanowire, nanoribbon or nanotube growth being done using the growth channel templates after the templates are positioned on the final substrate. In this channel template transfer technique, "grow-in-place" approach and the channel template transfer techniques for device fabrication are combined on diverse substrates, such as flexible substrates. The channel template including the long channel template or short template could be fabricated on a mother substrate such as a silicon, a metal, or glass substrate covered with a sacrificial layer (e.g., silicon oxide) and channel template floor layer (e.g., silicon nitride) on the substrate (FIGS. 4A and 5A). The sacrificial layer (e.g., silicon oxide) serves as the sacrificial material for the channel template release and the floor layer serves as the supporting floor of the template during template transfer. The channel template is fabricated on this sandwich structure as described in U.S. Patent Application Publication 2005/0176228 and other sources.[2] After the nanochannel template fabrication on the mother substrate, the template is transferred to a final substrate before or after nanowire growth. If the template transfer is done to a final high temperature stable substrate, the growth channel template is transferred before or after nanowire growth. If the template transfer is to a final substrate, such as plastic substrate, that is not stable at high temperatures, it is necessary to grow the nanowires, nanoribbons or nanotubes on the mother substrate first and then the template with the silicon nanowires, nanoribbons or nanotubes is transferred to the new substrate. A transfer layer is optionally applied on the channel template shown in FIGS. 4B and 5B. The transfer layer is formed from a variety of materials illustratively including polydimethyl siloxane. The sacrificial layer is readily removed by processing techniques illustratively including etching, ablation, agitation or a combination thereof in order to release the structures. The released structure shown in FIGS. 4C and 5C is transferred and stamped at desired positions onto different substrates, such as plastic substrates (FIGS. 4D and 5D). The transfer layer is then optionally removed. This growth channel template and transfer/stamp approach is very different from the transfer/stamp approach of Rogers et al.[21,22] The approach here does not use expensive SOI substrates as the mother substrate and instead grows the semiconductor using a catalyst technique such as the VLS method in growth channel templates. This growth step is optionally accomplished on a mother substrate and the mother substrates of this approach are both inexpensive and/or reusable.

Example 3

Thin Film Transistor Fabrication

As discussed above, an inventive device can be fabricated using ultra thin film semiconductors. These are deposited and defined, for example, by etching or are grown nanoribbons produced, for example, by the previously discussed VLS grown-in-place method. Unlike conventional TFT transitory, AMOSFETs fabricated with thin film semiconductors use films of only one doping type (and not n/i/n or p/i/p dopings) and the doping concentration is crucial in determining the on-current magnitude. As is also characteristic of AMOSFET devices, the on-current is not proportional to gate capacitance and gate insulator thickness control need not be of paramount concern.

Example 6

AMOSFETs Using SOI

High quality silicon on insulator type semiconductor materials is used to fabricate AMOSFETs. Unlike conventional SOI transitors, AMOSFETs fabricated with such film use only one doping type and the doping concentration is crucial in determining the on-current magnitude. As is also characteristic of AMOSFET devices, the on-current is not proportional to gate capacitance and gate insulator thickness control need not be of paramount concern.

References Cited

[1] S. J. Fonash, Y. H. Shan, C. Y. Peng, A. K. Kalkan, J. D. Cuiffi, D. Hayers, P. Butterfoss, W. J. Nam, U.S. Patent Application Publication No. 2005/0176228

[2] Shan, Y.; Kalkan, A. K.; Peng, C. Y.; Fonash, S. J. Nano Lett. 2004, 4, 2085

[3] Shan, Y.; Kalkan, A. K.; Fonash, S. J. Mater. Res. Soc. Symp. Proc. 2005, 0901-Rb08-02

[4] Shan, Y.; Fonash, S. J. 10th NSTI Proceeding 504, 2007

[5] Cui, Y.; Duan, X.; Hu, J.; Lieber, C. M. J. Phys. Chem. B, 2000, 104, 5213

[6] Wu, Y.; Xiang, J.; Yang, C.; Lu, W.; Lieber, C. M. Nature, 2004, 430, 61

[7] Duan, X.; Niu, C.; Sahi, V.; Chen, J.; Parce, J. W.; Empedocles, S.; Goldman, J. L. Nature, 2003, 425, 274

[8] Wang, Y.; Ho, T.; Dilts, S.; Lew, K.; Liu, B.; Mohney, S.; Redwing, J. M.; Mayer, T. S. 64th Device Research Conference Digest, June 2006

[9] Goldberger, J.; Hochbaum, A. I.; Fan, R.; Yang, P. Nano Lett. 2006, 6, 973

[10] Lew, K. K.; Redwing, J. M. J. Cryst. Growth 2003, 254, 14

[11] Wang, Y. F.; Lew, K. K.; Ho, T.; Pan, L.; Novak, S. W.; Dickey, E. C.; Redwing, J. W.; Mayer, T. S. Nano Letter 2005, 5, 2139

[12] Shir, D.; Liu, B. Z.; Mohammad, A. M.; Lew, K. K.; Mohney, S. E. J. Vac. Sci. Technol. B 2006, 24(3), 1333

[13] Westwater, J.; Gosain, D. P.; Tomiya, S.; Hirano, Y.; Usui, S. Mater. Res. Soc. Symp. Proc. 1997, 453, 237

[14] Wang, Y.; Lew, K.; Mattzela, J.; Redwing, J. M.; Mayer, T. S. 63rd DRC Proceeding, June 2005

[15] Lauhon, L. J.; Gudikson, M. S.; Wang, D.; Lieber, C. M. Nature, 2002, 420, 57

[16] Sze, S. M. Physics of Semiconductor Devices, John Wiley & Sons: New York 1981

[17] Jin, S.; Whang, D. M.; McAlpine, M. C.; Friedman, R. S.; Wu, Y.; Lieber, C. M. Nano Lett. 2004, 4, 915

[18] Wang, D.; Chang, Y.-L.; Wang, Q.; Cao, J.; Farmer, D. B.; Gordon, R. G.; Dai, H., J. Am. Chem. Soc. 2004, 126, 11602

[19] Cui, Y.; Zhong, Z.; Wang, D.; Wang, W.; Lieber, C. M. Nano Lett. 2003, 3, 149-152

[20] Madelung, O. (ed.) Technology and Applications of Amorphous Silicon (Springer, Berlin, 2000)

[21] Menard, E., Nuzzo, R. G., and Rogers, J. A., Appl. Phys. Lett. 86, 093507, 2005

[22] Menard, E., Lee, K. J., Khang, D.-Y., Nuzzo, R. G. and Rogers, J. A., Appl. Phys. Lett., 84(26), 5398, 2004

[23] Byon, K., Tham, D., and Fischer, J.E. Appl. Phys. Lett., 90, 143513, 2007.

[24] Fonash, S. J., Iqbal, M. M., Udrea, F. and Migliorato, P., Appl. Phys. Lett. 91, 1 (2007).

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A gated microelectronic device comprising:
an insulator substrate;
a source supported on said insulator substrate,
   said source having a first metal contact defining a first ohmic contact interface with said source,
   said source having
      a source dopant type and
      a source dopant concentration and
      defining a source linear extent;
a semiconducting drain supported on said insulator substrate,
   said semiconducting drain
   having a second metal contact defining a second ohmic contact interface with said semiconducting drain,
   said semiconducting drain having
      a drain dopant type and
      drain dopant concentration and
      defining a drain linear extent;
a channel portion intermediate between said source and said semiconducting drain,
   said channel portion supported on said insulator substrate and having
      a channel portion dopant type and
      channel portion dopant concentration and
      defining a channel portion linear extent and
      a channel portion thickness,
      at least said channel portion being a semiconducting nanowire or a nanotube;
an insulative dielectric in contact with said channel portion;
a gate in overlying contact with said insulative dielectric, said gate defining a gate-insulative dielectric interface;
said channel portion having a dimension normal to the gate-insulative dielectric interface suitable to fully deplete in an off-state;
a gate contact applying a gate voltage bias to control charge carrier accumulation and depletion in said channel portion; and
the source dopant, the drain dopant, and the channel portion dopant being all of a same type; and
wherein
   the first ohmic contact interface is noncontiguous with said channel portion and
   the source linear extent, the drain linear extent, and the positioning of the first ohmic contact interface and the second ohmic contact interface prevent ambipolar behavior in the device.

2. The device of claim 1 wherein the doping type is p-type and the gate voltage bias is negative and the drain voltage bias is negative to yield a device on-state status.

3. The device of claim 1 wherein the doping type is p-type and the gate voltage bias is positive and the drain voltage bias is negative to yield a device off-state status.

4. The device of claim 1 wherein the doping type is n-type and the gate voltage bias is positive and the drain voltage bias is positive to yield a device on-state status.

5. The device of claim 1 wherein the doping type is n-type and the gate voltage bias is negative and the drain voltage bias is positive to yield a device off-state status.

6. The device of claim 1 wherein the dimension of said channel region normal to the gate is between 5 and 100 nanometers.

7. The device of claim 1 wherein said channel portion is formed from organic semiconductors or inorganic semiconductors.

8. The device of claim 1 further comprising a second gate intermediate between said source and said semiconducting drain.

9. The device of claim 1 wherein said insulative dielectric forms a wrap-around contact with said channel portion.

10. The device of claim 1 wherein the channel portion is formed from one of: silicon, germanium, II-VI semiconductors, III-V semiconductors, or carbon.

11. A gated microelectronic device comprising:
a source having a first metal contact defining a first ohmic contact interface with said source,
   said source having
      a source dopant type and
      defining a source linear extent;
a semiconducting drain
   having a second metal contact defining a second ohmic contact interface with said semiconducting drain,
   said semiconducting drain having
      a drain dopant type and
      drain dopant concentration and
      defining a drain linear extent;
a channel portion intermediate between said source and said semiconducting drain,
   said channel portion supported on an insulator substrate and
      having a channel portion dopant type and
      defining a channel portion linear extent and
      a channel portion thickness,
      said channel portion being a nano wire or a nanotube;
an insulative dielectric in contact with said channel portion;
a gate in overlying contact with said insulative dielectric, said gate defining a gate-insulative dielectric interface;
said channel portion having a dimension normal to the gate-insulative dielectric interface suitable to fully deplete in an off-state;
a gate contact applying a gate voltage bias to control charge carrier accumulation and depletion in said channel portion; and
the source dopant, the drain dopant, and the channel portion dopant being all of a same type; and
wherein the first ohmic contact interface is non-contiguous with said channel portion and the source linear extent, the drain linear extent, and
the positioning of the first ohmic contact interface and the second ohmic contact interface prevent ambipolar behavior in the device.

12. The device of claim 11 wherein the doping type is p-type and the gate voltage bias is negative and the drain voltage bias is negative to yield a device on-state status.

13. The device of claim 11 wherein the doping type is p-type and the gate voltage bias is positive and the drain voltage bias is negative to yield a device off-state status.

14. The device of claim 11 wherein the doping type is n-type and the gate voltage bias is positive and the drain voltage bias is positive to yield a device on-state status.

15. The device of claim 11 wherein the doping type is n-type and the gate voltage bias is negative and the drain voltage bias is positive to yield a device off-state status.

16. The device of claim 11 wherein the dimension of said channel region normal to the gate is between 5 and 100 nanometers.

17. The device of claim 11 wherein said channel portion is formed from organic semiconductors or inorganic semiconductors.

18. The device of claim 11 further comprising a second gate intermediate between said source and the semiconducting drain.

19. The device of claim 11 wherein the channel portion is formed from one of: silicon, germanium, II-V1 semiconductors, III-V semiconductors, or carbon.

* * * * *